United States Patent
Weng

(10) Patent No.: US 6,381,726 B1
(45) Date of Patent: Apr. 30, 2002

(54) ARCHITECTURE FOR SOFT DECISION DECODING OF LINEAR BLOCK ERROR CORRECTING CODES

(75) Inventor: Lih-Jyh Weng, Needham, MA (US)

(73) Assignee: Maxtor Corporation, Longmont, CO (US)

(*) Notice: Subject to any disclaimer, the term of this patent is extended or adjusted under 35 U.S.C. 154(b) by 0 days.

(21) Appl. No.: 09/225,260

(22) Filed: Jan. 4, 1999

(51) Int. Cl.$^7$ .............................................. H03M 13/00
(52) U.S. Cl. ...................................... 714/780; 714/755
(58) Field of Search ................................ 714/780, 760, 714/774, 755, 756, 52; 364/265, 265.1, 944.5

(56) References Cited

U.S. PATENT DOCUMENTS

| | | | | |
|---|---|---|---|---|
| 5,278,846 A | * | 1/1994 | Okayama et al. | 714/755 |
| 5,742,620 A | * | 4/1998 | Iwamura | 714/784 |
| 5,757,821 A | * | 5/1998 | Jamal et al. | 714/746 |
| 5,875,199 A | * | 2/1999 | Luthi | 714/780 |
| 5,968,198 A | * | 10/1999 | Hassan et al. | 714/752 |

OTHER PUBLICATIONS

Yu et al., "Soft–Decision Decoding Implementation with Reduced Complexity for Binary Block Codes," IEEE Proceedings in Information Theory, 1994, p. 403.

Swaszek, "When is Hard Decision Decoding Enough?", IEEE Internationa Symposium, Proceedings in Information Theory, 1995, p. 54.

Swaszek et al., "How Often is Hard–Decision Decoding Enough?", IEEE Transactions on Information Theory, vol. 44, No. 3, May 1998, 1187–1193.

\* cited by examiner

*Primary Examiner*—Trinh L. Tu
(74) *Attorney, Agent, or Firm*—David M. Sigmond

(57) ABSTRACT

A method and apparatus for decoding a corrupted code word is described. Decoding is accomplished by using a decoder that has a common measure of reliability for each symbol of the corrupted code word and determining whether a useful result can be obtained from the first decoder. If a useful result can not be obtained decoding the corrupted code word is accomplished with a second decoder that uses unique values of reliability for each symbol of the corrupted code word.

20 Claims, 2 Drawing Sheets

Figure 1:
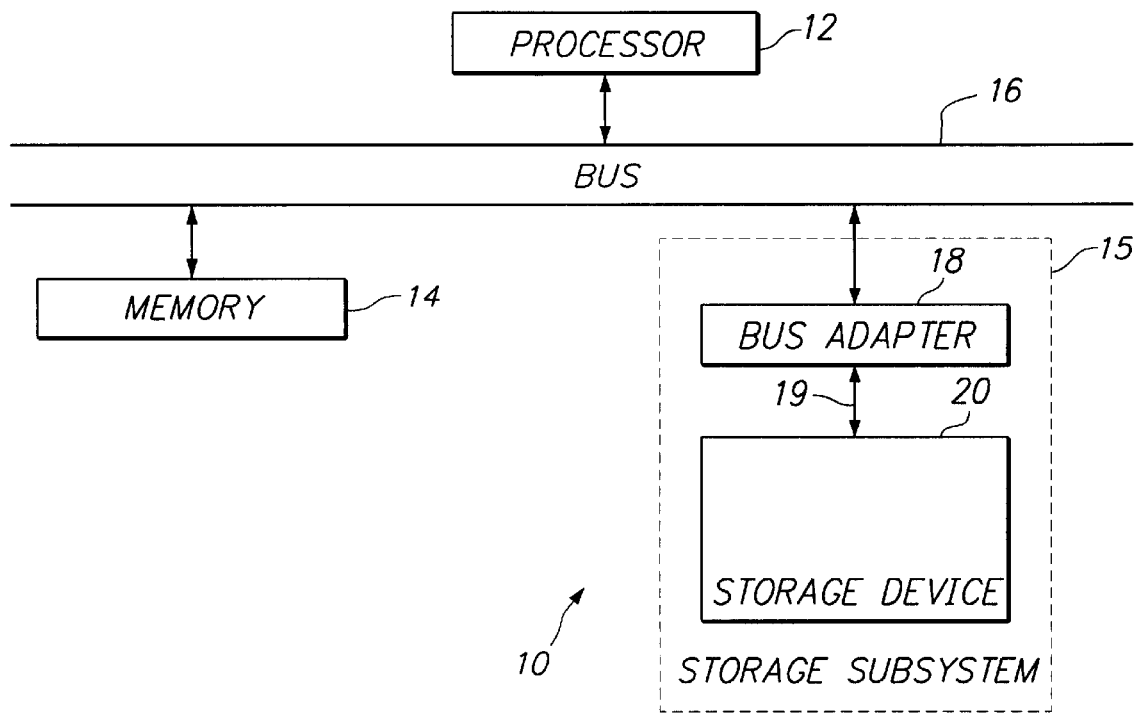
Figure 2:
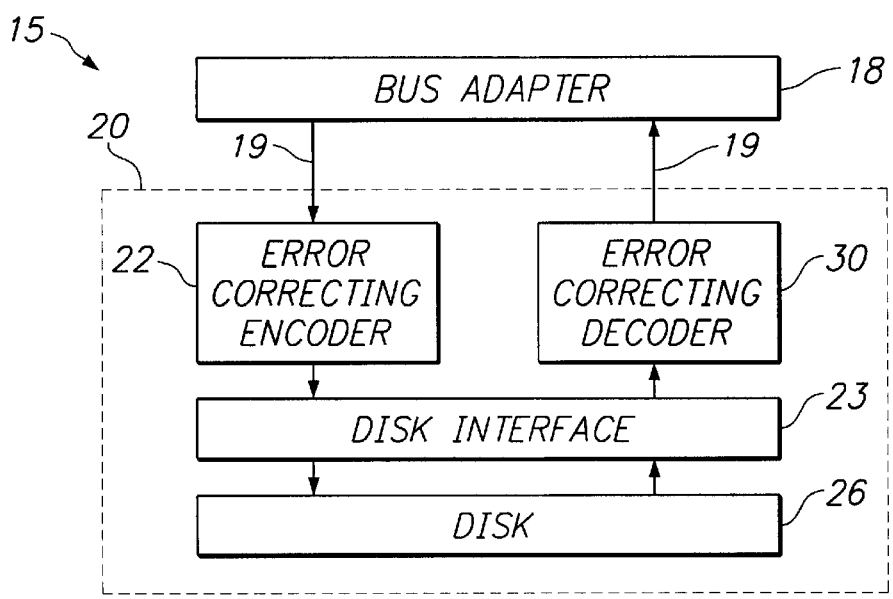
Figure 3:
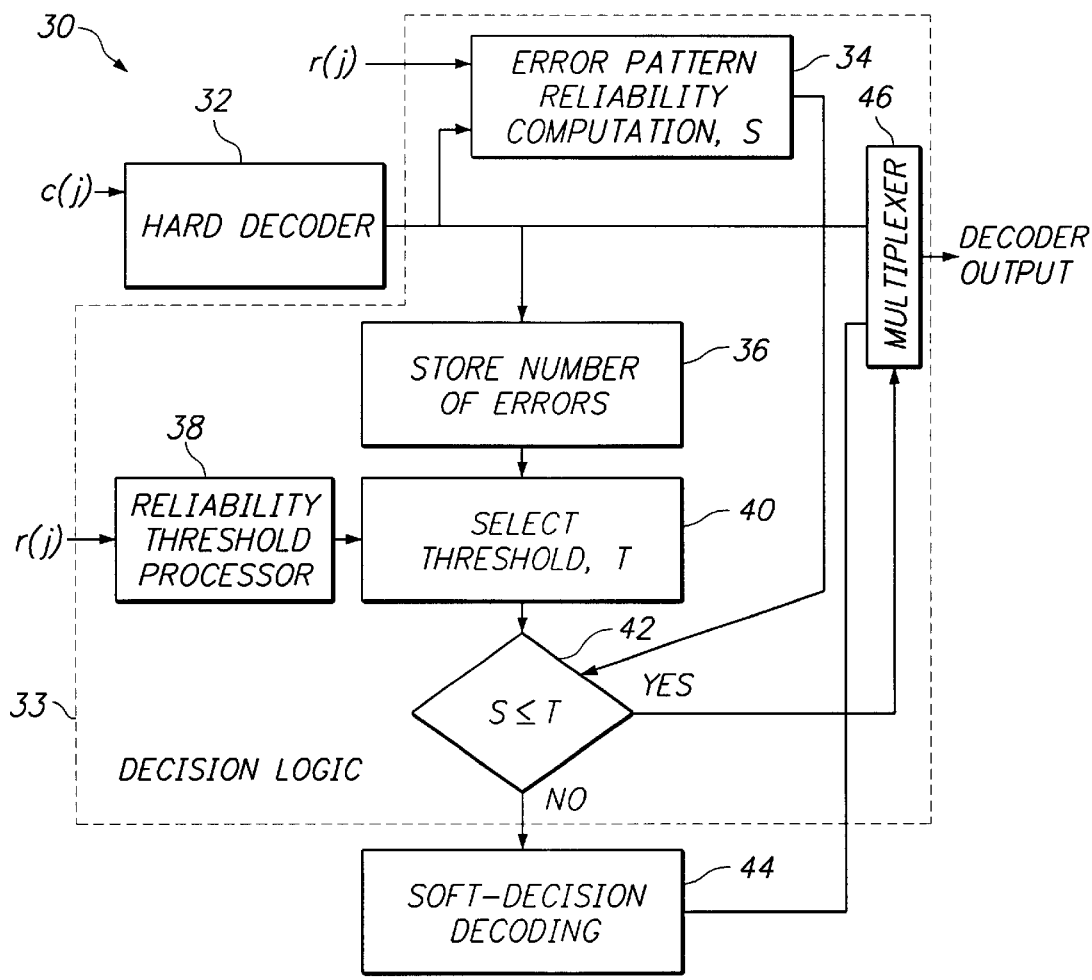

ARCHITECTURE FOR SOFT DECISION DECODING OF LINEAR BLOCK ERROR CORRECTING CODES

BACKGROUND

This invention relates to error correcting code techniques.

Error correcting code techniques are used in digital systems to correct and detect errors in digital data. Such techniques are particularly employed with magnetic disks that can have relatively high error rates due to manufacturing defects and so forth. Several types of error correcting techniques are known. One type of error correcting technique uses so-called "block codes." An example of a block code is the so-called "Reed Solomon (RS) code." Block codes such as the Reed-Solomon block code operate on data symbols. Data symbols are vectors of binary bits of data. Symbols are generated by grouping bits at a particular bit position for a group of words into a vector. When block codes are used in a disk drive, before a string of data symbols are recorded on a disk, the string is mathematically encoded producing error correcting code symbols that are appended to the data symbols to form code words. These code words i.e., data symbols and error correcting code symbols are stored on the disk. When the stored data is retrieved from the disk, the code words are mathematically decoded to form decoded code words.

Multiple data errors in the data symbols can be corrected if the number of such data errors does not exceed the maximum number of errors for which the algorithm was designed. Currently, most decoding schemes use so-called "hard decoding." Hard decoding is a technique in which each symbol of a corrupted code word has exactly the same measure of reliability as each other symbol. For the sake of convenience, generally the measure of reliability of each symbol is assigned a value of one. A second technique, so-called "soft-decision decoding" uses a unique measure of reliability for each symbol. Each symbol is assigned a unique value between 0 and 1 or any range of values. The soft decision decoding algorithms, although capable of correcting more errors and therefore being more robust and of higher performance, tend to be very complicated. Therefore, practical implementations of soft-decision decoding tend to be slow or if sufficient hardware is used to increase speed, expensive and thus often impractical.

SUMMARY

According to an aspect of the present invention, a method an apparatus for decoding a corrupted code word includes decoding the corrupted code word with a first decoder that has a common measure of reliability for each symbol of the code word and determining whether a useful result can be obtained from the first decoder. If a useful result can not be obtained, decoding the corrupted code word with a second decoder that uses unique values of reliability for each symbol of the corrupted code word.

One or more of the following advantages are provided. Hard decoding can be used for most error occurrences and the slower soft-decision decoding can be used for the less frequent occurrences. This would improve overall performance. Optionally the hard-decoding can be designed to handle fewer errors than its maximum amount. In other words, the implemented hard-decoder may not have to fully or completely implement the error correcting capability of a selected hard-decoding algorithm. The hard decoding only needs to correct the most likely number of errors, e.g., one or two per symbol, and leave the less likely larger number of errors to the soft decision decoding. By correcting only a fraction of the symbol errors correctable by a full hard-decoder implementation it would save hardware and be faster overall, by letting the soft decision decoding correct the less frequent but higher number of errors.

BRIEF DESCRIPTION OF THE DRAWINGS

FIG. 1 is a block diagram of a computer including a storage subsystem.

FIG. 2 is a block diagram of the storage subsystem of FIG. 1.

FIG. 3 is a block diagram of an error correcting decoder in the storage device of the storage subsystem of FIG. 2.

FIGS. 4 and 5 are flow charts of exemplary techniques for producing reliability thresholds for the decoder of FIG. 3.

DETAILED DESCRIPTION

Referring now to FIG. 1, a computer system 10 includes a processor 12, a main memory 14 and a storage subsystem 15 all coupled via a computer bus 16. The storage subsystem 15 includes a bus adapter 18, a storage bus 19, and a storage device 20. A preferred example of the storage device 20 is a magnetic disk drive. Other examples include an optical disk drive, a magnetic tape and a solid-state disk drive.

Referring now to FIG. 2, of the storage subsystem 15 is shown. The storage includes an error correcting encoder 22 and an error correcting decoder 30. Error correcting encoder 22 is fed input data from the bus adapter 18 and generates error correcting code symbols that are concatenated with or associated with data symbols and fed to a disk interface 23 for storage on disk 26 during a write-to-disk operation. During a read-from-disk operation, the data symbols and check symbols are retrieved from the disk 26. The data symbols are fed to the disk interface 23 and to the decoder 30. The decoder 30 generates a set of error correcting code symbols from the retrieved data symbols. The generated symbols are compared to the error correcting check symbols retrieved from disk 26. The decoder 30 corrects such errors, providing they do not exceed the error correcting capability of the decoder 30. The decoder 30 includes a hard decoder and a soft-decision decoder to decode a corrupt word and decision logic to decide whether the decoder should use the hard or soft-decision decoding.

Referring now to FIG. 3, the decoder 30 for linear block error correcting codes includes a hard decoder 32 which operates in accordance with any one of a number of well-known hard decoding algorithms. The hard decoder 32 implements a fast, hard decoding technique to provide the principal technique to decode corrupted code words c(j) fed to the decoder 30. The decoder 30 also includes decision logic 33. The decision logic 33 examines the output from the hard decoder 32 to determine whether the output from the hard decoder 32 can be accepted as the output from the decoder 30. If the output from the hard decoder 32 can not be accepted, the decision logic 33 will invoke a soft-decision decoding process to provide the decoded output from the decoder 30.

The corrupt word c(j) are fed to the hard decoder 32. From the corrupt words c(j), the hard decoder 32 produces an error pattern of e number of non-zero symbols represented as b(1), b(2), . . . b(e), with $e<d/2$. The error pattern b(1), b(2), . . . b(e) is fed to an error pattern reliability computation circuit 34. A circuit 36 stores the number of errors in the corrupt word., as determined by the hard decoder 32

The corrupted code words c(j) have associated therewith corresponding reliabilities r(j) which are generated or provided by a channel processore (not shown). The values of these reliability measures along with the error pattern symbols b(j) are fed to the error pattern reliability computation circuit 34. The error pattern reliability computation circuit 34 tallies the reliability of the error pattern symbols b(j) as $$S=s(1)+s(2)+ \ldots +s(e),$$

where s(j) is the reliability for the location associated with b(j).

The decision logic 33 includes a circuit 36 that counts the number of errors (e.g., the number of b(j) terms) provided in the output from the hard decoder 32. Based upon the number of errors counted, a selector 40 selects one of a plurality of reliability thresholds. The reliability thresholds are determined by a reliability threshold processor 38. The reliability threshold processor 38 operates on the reliability inputs r(j) to produce a set of output thresholds T(d-1), T(d-2), . . . , T(d__max-1) and T(d-e__max) in accordance with the value e(max). Thus, all of the thresholds are calculated or determined based upon the number of errors that can occur in a corrupted code word. These thresholds are selected for each corrupted code word by the selector 40.

Optionally, the maximum value of e, denoted by e__max, provided by the hard-decoder can be designed to be much smaller than (d-1)/2. In other words, the implemented hard-decoder may not have to fully or completely implement the error correcting capability of a selected hard-decoder algorithm. The hard decoder only needs to correct the most likely number of errors, e.g., one or two per symbol, and leave the less likely and larger number to the soft decision decoder. By correcting only a fraction of the symbol errors correctable by a full hard-decoder implementation it would save hardware and be faster overall by letting the soft decision decoder correct the less frequent but higher number of errors. In the event that the hard decoder 32 fails to provide an error pattern, the reliability measure S is arbitrarily set to a very large number. This will ensure that the soft-decision decoding algorithm will be invoked.

The selected reliability threshold by selector 40 is compared 42 with the error pattern reliability output S to determine whether the output of the hard decoder 32 can be accepted as the output of decoder 30 or whether a soft decision decoding process 44 should be invoked to provide the output from decoder 30. If the reliability measure S is less than or equal to the selected threshold (T), the hard decoding pattern is accepted as the final decoder pattern. Otherwise, the more time consuming or more complex soft decision decoding algorithm is invoked to produce the final decoded error pattern. Multiplexer 46 outputs the final decoded error pattern from decoder 30.

It is important that the thresholds are computed in such a way that when S less than or equal to the threshold, the hard decoder output is the same as the soft-decision decoding output. On the other hand, when S is greater than the threshold, the hard decoder output error pattern may or may not be the same as the soft-decision output. Any algorithm for producing such thresholds can be used to compute the thresholds; two examples are given below.

Figure 4:
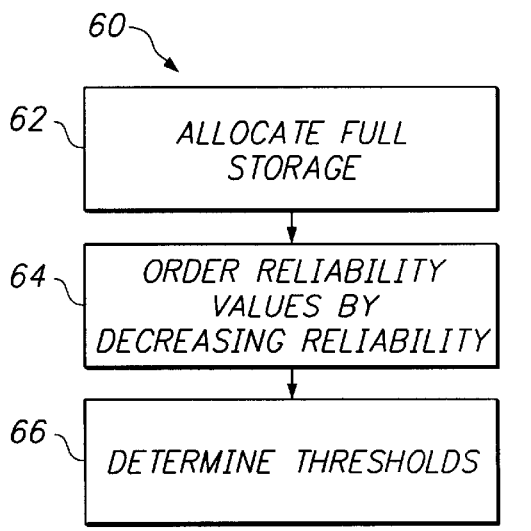

Referring now to FIG. 4, a process 60 to produce thresholds is shown. The process 60 (referred to as the full storage process) allocates 62 storage elements to each of the reliability values of r(j). Initially, all the values m(j) are set equal to 1, the highest reliability value. The full storage process 60 orders 64 the reliability values by decreasing reliability value by searching for a reliability that is less than the initial stored value in the storage elements. When such a value is found, the reliabilities are stored as the least reliability measures of d-1 symbols sorted in order with m(1) storing the least reliable measure.

---

For each new r(j),
it r(j) > m(d-1) do nothing;
otherwise compare r(j) to m(d-1),m(d-2), . . . ,
until r(j) < m(k) and r(j) > m(k-1)
then set   m(d-1) = m(d-2)
m(d-2) = m(d-3)
. . . . . . . . . . . . .
m(k+1) = m(k)
m(k) = r(j).

---

After the values have been orderly stored, the thresholds are determined 66 by simply summing the values in each of the storage elements M(1)–m(k) for k=d-emax, . . . , d–2, d–1.

This process produces useful thresholds because the hard decoder 32 produces an error pattern with e number of errors and a reliability measure of S. Another error pattern, as shown below, will contain at least (d-e) non-zero symbols. Any d-e non-zero symbols will have a reliability measure of at least T(d-e). With the reliability measure S less than or equal to the threshold, it would be impossible to find an error pattern with a reliability measure smaller than S. Therefore, when S is less than or equal to the threshold, the hard decoder 32 output will be the same as the best soft decision output and, thus, it is proper to select the output from the hard decoder 32 as the output from the circuit 30.

Figure 5:
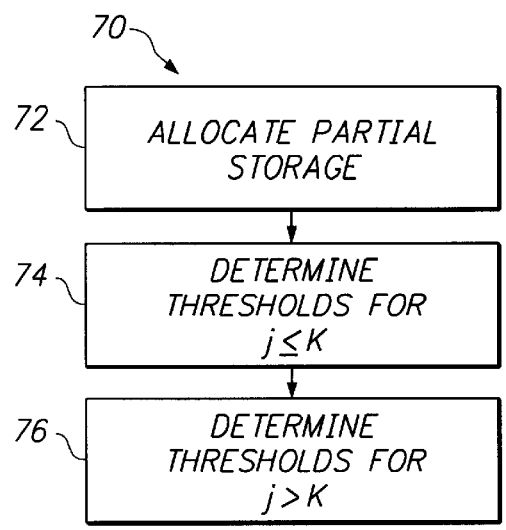

Referring now to FIG. 5, an alternate process 70 for determining a reliability threshold (partial storage process) includes allocating 72 partial storage to store only a portion of the least reliable symbols. This approach uses only k number of storage elements to store the k least reliability measures that can have any value between 1 and d–2. The thresholds are determined 74 by:

$$T(j)=m(1)+m(2)+ \ldots +m(j)$$

for j≦K and are determined 76 for j>K by $$T(j)=m(1)+m(2)+ \ldots +m(K-1)+(j-K+1)*m(K)$$

In other words, the values of m(K+1), m(K+2), . . . , m(d-1) of the full storage process 60 of FIG. 4 are all replaced by the same value m(K) in this partial storage process 70. The thresholds of this partial storage process 70 are identical to those in full storage process 60 for thresholds of T(j) where j is ≤ K. For j>K the thresholds in this partial storage process 70 are smaller than those found in full storage process 60. Consequently, more hard decoder error patterns will be rejected using this partial storage process 70. However, the value of K is correctly chosen. The values of m, K and j should be very close to the values of m(K). In this instance, the values of all the thresholds in this partial storage process 70 are practically the same as those shown in the full storage process 60 of FIG. 4. This partial storage process 70 however, has less comparison and insertion operations especially when the value of K is small.

In hard decoding, each symbol of the corrupted code word has exactly the same measure of reliability. For the sake of convenience, the measure of reliability of each symbol is assigned a value of 1. In soft-decision decoding, however, the measure of reliability for each symbol is assigned a unique value, e.g., between 0 and 1 or in general any range of values, as described above. Hard decoding, therefore, is a special case of the more general soft-decision decoding process. To be useful, in soft decision decoding a reliability measure must have the characteristics that the reliability of a set of symbols can be obtained from the reliabilities of the individual symbols in the set. Therefore, if R is the reliability measure of the set of symbols, {a(1), a(2), . . . , a(e)}, and r(j) is the reliability measure of a(j), then two simple relations can be obtained.

$$R = r(1) + r(2) + \ldots r(e), \text{ or} \quad (1)$$

$$R' = r'(1) * r'(2) * \ldots * r'(e) \quad (2)$$

These two relationships are related by a logarithmic operation. As used herein, Equation 1 is used to compute the reliability measure. This reliability measure operates on block codes. A block code is characterized by three parameters (n, k, d) where n is the total number of symbols per code word, k is the number of information symbols per code word and d is the minimum Hamming distance between any two corrupted code words. A suitable hard decoding algorithm can correct up to, and including, (d−1)/2 symbol errors in a corrupted code word.

The technique described herein is applicable to all linear block (n, k, d) codes that have at least one known hard decoding algorithm that is capable of producing a unique error pattern containing (d−1)/2 or fewer symbol errors. A linear block code has the characteristic that the addition of two code words results in another code word. The addition of codeword (a(1), a(2), . . . , a(n)) and codeword (b(1), b(2), . . . , b(n)) is defined to be (a(1)+b(1), a(2)+b(2), . . . , a(n)+b(n)), where+denotes the field addition for the underlying field over which the code symbols a(j) and b(j) are defined.

Some examples should suffice. The following two examples serve the purpose of illustrating the effect of hard decoding and soft-decision decoding.

EXAMPLE 1

Let a Reed-Solomon (7,3,5) code word be
 (001, 011, 100, 110, 110, 001, 100)
and the corrupted code word be
 (000, 011, 101, 100, 110, 001, 100)
and the reliability measure be:
 (0.1, 0.3, 0.2, 0.3, 0.5, 0.9, 0.9).

As used herein, the notation for the n-tuple (c(1), c(2), . . . , c(n)) is a code word, a corrupted code word or an error pattern with symbols c(j) separated by commas; an n-tuple (r(1), r(2), . . . , r(n)) is the reliability measure with r(j) the reliability measure for c(j). C(j) is a symbol contains m binary bits (in Example 1, m=3) and r(j) is a real number. In this example, 0.0 is the least reliable measure for a symbol and 1.0 is the most reliable measure.

Comparing, i.e., Exclusive Oring the code word and corrupted code word on a symbol-by-symbol basis, produces the error pattern:
 (001, 000, 001, 010, 000, 000, 000).

In this error pattern, an all-zero symbol means that the particular symbol is correct. A non-zero symbol denotes the error value of that symbol. Therefore, with the above error pattern there are three errors.

The error values and their respective reliability measures are: a(1)=001, r(1)=0.1; a(2)=001, r(2)=0.2; a(3)=010, r(3)=0.3. Using Equation 1, R=0.1+0.2+0.3=0.6. Therefore, the reliability measure of this error pattern is 0.6.

A good soft-decision decoding algorithm should produce this same error pattern as its output. Since this is a minimum distance 5 code, the hard decoding is capable of correcting two or fewer errors. If a hard decoding algorithm is applied to the above corrupted code word, the hard decoder output error pattern is (000, 011, 000, 000, 110, 000, 000) with a' (1)=011, r' (1)=0.3; a'(2)=110, r'(2)=0.5. Again, by Equation 1, the reliability of this hard error pattern is given by: R'=0.3+0.5=0.8>0.6=R. This implies that the error pattern provided by the soft-decision algorithm has a higher probability to be the correct error pattern. Therefore, the error pattern provided by the hard decoder should be rejected.

The full storage process 60 produces thresholds as follows: When the hard decoder 32 produces an error pattern with e errors and a reliability measure of S, another error pattern, as shown below, contains at least (d-e) non-zero symbols. Any pattern with (d-e) non-zero symbols will have a reliability measure of at least T(d-e). With S≦T[d-e], it is impossible to find an error pattern with reliability measure smaller than S. Therefore, when S≦T[d-e], the hard decoder output is the same as the "best" soft-decision decoding output.

In example 1 therefore, d=5 and the reliability measures are given by:
 (0.1, 0.3, 0.2, 0.3, 0.5, 0.9, 0.9).
Therefore, m[1]=0.1, m[2]=0.2, m[3]=0.3, and m[4]=0.3 are the d−1 or 4 least reliable measures stored in order. Then the thresholds are:

$$T[d-1]=T[4]=m[1]+m[2]+m[3]+m[4]=0.9$$

$$T[d-2]=T[3]=m[1]+m[2]+m[3]=0.6.$$

When the hard decoder produces the error pattern (000, 011, 000, 000, 110, 000, 000) with a'[1]=011, r'[1]=0.3; a'[2]= 110, r'[2]=0.5; and e=2, the reliability of this error pattern is given by R'=0.3+0.5=0.8>T[d−e]=T[d−2]=0.6. Consequently, this decoded error pattern should not be accepted immediately. There is a chance that the soft-decision decoding output may produce an error pattern with lesser reliability measure.

EXAMPLE 2

Let the original code word be the same as the one given in Example 1. But the code word is now corrupted to be (001, 011, 100, 001, 110, 001, 100) with the reliable measure (0.7, 0.8, 0.7, 0.9, 0.6, 0.6, 0.5). Soft-decision decoding should produce the error pattern (000, 000, 000, 111, 000, 000, 000) with a(1)=111 and r(1)=0.9. This will also be the error pattern obtained by the hard decoding. In this case, the output of the hard decoder should be accepted without the need to go to soft-decision decoding. From the above two examples, it can be seen that the result of a hard decoding may be identical to the result of the soft-decision decoding.

By establishing the simple criteria, as set forth above, to determine if the result of a hard decoding output is identical to the result of a soft-decision decoding output, this criterion can be used to decide whether or not to trigger the more complex and time-consuming process of soft-decision decoding. Similarly, the full storage process 60 provides a threshold in this instance. The reliability measure for the corrupted code word is (0.7, 0.8, 0.7, 0.9, 0.6, 0.6, 0.5), as given above. The hard decoded output produces the error pattern (000, 000, 000, 111, 000, 000, 000) with a'(1)=111, r'(1)=0.9 and e=1. The m(j)'s are m(1)=0.5, m(2)=0.6, m(3)=0.6, m(4)=0.7 and the thresholds are given by:

$$T(d-1)=m(1)+m(2)+m(3)+m(4)=2.4$$

$$T(d-2)=m(1)+m(2)+m(3)=1.7$$

The hard decoded error pattern contains only one error, i.e., e=1. Therefore, R'=r(1)=0.9. This value is smaller than T(d−e)=T(d−1)=2.4. Therefore, this hard decoded error pattern is the same as the best soft-decision decoded output. Consequently, this output can be accepted as the final output and there is no need to go to soft decision decoding at all.

Because the threshold T(k) is greater than T(k−1) for all k and the reliability measure of e decoded hard errors is compare to T(d−e), the probability that a lower weight error pattern exceeds the threshold is much smaller than that the error pattern having the higher weight. It should also be noted that the reliability measure of a high weight error pattern is often greater that a lower weight error pattern. This further increases the probability that a low weight hard decoded error pattern is identical to the soft-decision decoded error pattern.

The output of a hard decoding algorithm for an (n,k,d) code produces an error pattern with e non-zero symbols, where e<d/2, if successful. As shown below, any other error pattern will have at least d−e non-zero symbols. This property is used to form the basis to determine if a hard decoded error pattern has the chance to be identical to a soft-decision decoding or not. It is important that the acceptance criteria can be in error in one direction. In other words, if a criterion accepts the hard decoded error pattern, the error pattern must be identical to that of a soft-decision decoder output; on the other hand, when the criterion rejects a hard decoded error pattern, the error pattern can still be identical to the soft-decision output (the penalty in this case is throughput but not performance). A good criterion should reject as few hard decoder output as possible when that output is identical to the soft-decision decoder output.

This architecture can be used with an error-and-erasure decoding algorithm. An error-and-erasure decoding algorithm classifies each of the symbols of a corrupted code word into one of two classes: one class called erasures which are symbols with less reliability and the other class contains non-erased symbols. There are other error-and-erasure decoding algorithms which are slightly more complex than the error-only hard-decoding. The full storage process 60 of FIG. 4 can employ the hard decoding to decode the corrupted code word containing erasures.

The decoding will assign a reliability value of 1 to any non-erasure symbol and a reliability value of 0.5 to any erasure symbol. For "e_erasure" erasure symbols in the corrupted code word; then m[1]=0.5, m[2]=0.5, . . . , m[e_erasure]=0.5, m[j]=1 for j>e_erasure. The thresholds are then given by $$T[j]=0.5*j$$

for j>e_erasure, and $$T[j]=0.5*e\_erasure+(j−e\_erasure)=j−0.5*e\_erasure \text{ for } j>e\_erasure.$$

The process uses the hard decoder 32 to obtain an error pattern with "e_hard" errors and will accept the hard decoder 32 output as the final decoded output from the decoder 30 if the reliability computed for the error pattern is equal to or less than T[d−e_hard]. Otherwise, the error-and-erasure algorithm is invoked to obtain the final decoded code word.

It should be noted that the thresholds T[j] can be computed for each value of e_erasure. Therefore, it is not required to process the reliability information for each symbol. In the hard decoded output, the reliability of the error pattern is given by:

$$0.5*e1+(e\_hard−e\_1)=e\_hard−0.5*e\_1,$$

where e_1 is the number of erasure symbols in the decoded error pattern. Furthermore, each of the erasure symbols may be fed to the hard decoder as is or replaced by any fixed value (e.g., the all zero symbol.) There is a weighting relationship among error patterns in linear block codes. For a linear block (n,k,d) code, there exists an n x (n−k) parity matrix H such that:

$$H*C\sim=0$$

where C~ is the transpose of a 1×n code word C. Given a corrupted code word C'=C+E, where E is an error pattern, a hard decoding algorithm will recover E if the Hamming weight of E is less than or equal to (d−1)/2. (The Hamming weight of an n-tuple is the number of non-zero elements in the n-tuple.) A hard decoding algorithm often starts with the computation of an error syndrome "Y", or an equivalent computation. For a value of Y equal to zero that would indicate that there is no error. For a value of Y not equal to zero that would indicate an error and additional processing to correct the error.

$$Y=H*(C')\sim$$

However, by straightforward expansion Y is:

$$Y=H*(C\sim+E\sim)=H*E\sim \quad \text{Equation 3}$$

For each error pattern E, there is a unique value of Y. However, there are $q^k$ error patterns which will have the same value of Y. This can be seen from Equation 3 by assigning any one of the $q^k$ code words as C. For a given value of Y [an (n−k)-tuple], a hard decoding algorithm will produce an n-tuple with (d−1)/2 or fewer non-zero symbols as the decoded error pattern.

An ideal soft-decision decoding algorithm provides an error pattern E_soft, which satisfies:

$$H*E\_soft\sim=Y$$

and the reliability measure of E_soft is the smallest one among all of the error patterns E which satisfy the equation $$H*E\sim=Y$$

When the hard decoding obtain an error pattern E_hard with e≦(d−1)/2 symbol errors, another error pattern will be of the form E_hard+C, where C is a code word. Since the minimum distance of the code is d, C contains at least d'≧d non-zero symbols. This is because all-zero n-tuple is a codeword of a linear (n,k,d) code. Therefore, the error pattern can have a weight anywhere from (d'−e) to (d'+e) non-zero symbols. When the non-zero symbols of E_hard do not overlap with any of the non-zero symbols of C, (E_hard +C) has (d'+e) non-zero symbols. When the non-zero symbols of E_hard come from a selection of e non-zero subset of C, the non-zero elements of (E_hard +C) is (d'−e). The smallest value of (d'−e) is (d−e). Therefore, any other error pattern contains at least (d−e) non-zero symbols.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method of decoding a corrupted code word comprising:

decoding the corrupted code word with a first decoder that uses a common measure of reliability for each symbol of the corrupted code word;

determining whether a useful result can be obtained from the decoding with the first decoderp; and if not, then decoding the corrupted code word with a second decoder that uses unique values of reliability for each symbol of the corrupted code word.

2. The method of claim 1 wherein the determining further comprises calculating a reliability threshold corresponding to an error in the corrupted code word.

3. The method of claim 2 wherein the determining further comprises determining an aggregate reliability of the decoding with the first decoder; and comparing the aggregate reliability to the reliability threshold to determine whether a useful result can be obtained from the decoding with the first decoder.

4. The method of claim 1 wherein the determining further comprises determining a set of reliability thresholds.

5. The method of claim 4 wherein determining further comprises determining an aggregate reliability of the first decoder.

6. The method of claim 5 wherein the determining further comprises:

determining the number of errors from the corrupted code word;

selecting an error threshold based upon the number of errors and the reliability thresholds; and comparing the aggregate reliability with the error threshold to determine whether the decoding with the first decoder can provide a useful result from decoding the corrupted code word.

7. The method of claim 1 wherein the decoding with the first decoder is hard decoding.

8. The method of claim 1 wherein the decoding with the second decoder is a soft-decision decoding.

9. The method of claim 1 wherein the decoding with the second decoder is error and erasure decoding.

10. The method of claim 1 wherein the corrupted code word is generated by a linear block code.

11. The method of claim 1 wherein if the determining determines that decoding with the first decoder provides a useful result, then using the result as the decoding of the corrupted code word.

12. A system to decode a corrupted word for a linear block error correcting code comprises:

a hard decoder that has a common measure of reliability for each symbol of a corrupted code word;

logic that determines whether a useful result can be obtained from the hard decoder and, a soft-decision decoder that uses unique values of reliability for each symbol of the corrupted code word.

13. The system of claim 12 wherein the logic that determines further comprises a processor to calculate a reliability threshold corresponding to an error in the corrupted code word.

14. The system of claim 12 wherein the logic to determine further comprises logic to determine an aggregate reliability from the hard decoder; and compare logic to compare the aggregate reliability of the hard decoder to the reliability threshold to determine whether a useful result can be obtained from the hard decoder.

15. The system of claim 12 wherein the logic to determine further comprises logic to determine a set of reliability thresholds.

16. The system of claim 15 wherein the logic to determine further comprises logic to determine an aggregate reliability from the hard decoder.

17. The system of claim 16 further comprising:

a selector to select an error threshold based upon the number of errors in the corrupted code word; and logic to compare the aggregate reliability with the threshold reliability to determine whether the hard decoder can provide a useful result.

18. The system of claim 12 wherein second decoder is soft decision decoder.

19. The system of claim 12 wherein second decoder is an error and erasure decoder.

20. The system of claim 12 wherein the corrupted code word is generated by a linear block code.

* * * * *